(12) United States Patent
Wang

(10) Patent No.: US 7,750,338 B2
(45) Date of Patent: Jul. 6, 2010

(54) DUAL-SIGE EPITAXY FOR MOS DEVICES

(75) Inventor: Yin-Pin Wang, Kaohsiung (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 78 days.

(21) Appl. No.: 11/633,855

(22) Filed: Dec. 5, 2006

(65) Prior Publication Data

US 2008/0128746 A1    Jun. 5, 2008

(51) Int. Cl.
   *H01L 31/00* (2006.01)
(52) U.S. Cl. .............. 257/19; 257/18; 257/20; 257/55; 257/63; 257/65; 257/E21.43; 257/E21.431; 257/E21.438; 257/E29.085; 257/E29.266; 438/37; 438/41; 438/44; 438/256; 438/300
(58) Field of Classification Search .......... 257/288, 257/327, 344, E29.05, E29.012, E21.43, 257/E21.431, E21.438, E29.085, E29.266, 257/18–20, 55, 63, 65; 438/37, 41, 44, 256, 438/300
See application file for complete search history.

(56) References Cited

U.S. PATENT DOCUMENTS

| | | | | |
|---|---|---|---|---|
| 6,492,665 | B1* | 12/2002 | Akamatsu et al. | 257/192 |
| 7,078,742 | B2* | 7/2006 | Lin et al. | 257/190 |
| 7,335,959 | B2* | 2/2008 | Curello et al. | 257/408 |
| 2003/0052348 | A1* | 3/2003 | Takagi et al. | 257/288 |
| 2005/0082522 | A1* | 4/2005 | Huang et al. | 257/19 |
| 2007/0235802 | A1* | 10/2007 | Chong et al. | 257/346 |

* cited by examiner

*Primary Examiner*—Lynne A Gurley
*Assistant Examiner*—Meiya Li
(74) *Attorney, Agent, or Firm*—Slater & Matsil, L.L.P.

(57) ABSTRACT

A semiconductor includes a semiconductor substrate, a gate stack on the semiconductor substrate, and a stressor having at least a portion in the semiconductor substrate and adjacent to the gate stack. The stressor includes a first stressor region and a second stressor region on the first stressor region, wherein the second stressor region extends laterally closer to a channel region underlying the gate stack than the first stressor region.

20 Claims, 5 Drawing Sheets

DUAL-SIGE EPITAXY FOR MOS DEVICES

TECHNICAL FIELD

This invention relates generally to integrated circuits, and more particularly to structure and formation methods of metal-oxide-semiconductor (MOS) devices with stressors.

BACKGROUND

Reductions in the size and inherent features of semiconductor devices (e.g., a metal-oxide semiconductor field-effect transistor) have enabled continued improvement in speed, performance, density, and cost per unit function of integrated circuits over the past few decades. In accordance with a design of the transistor and one of the inherent characteristics thereof, modulating the length of a channel region underlying a gate between a source and drain of the transistor alters a resistance associated with the channel region, thereby affecting the performance of the transistor. More specifically, shortening the length of the channel region reduces a source-to-drain resistance of the transistor, which, assuming other parameters are maintained relatively constant, may allow an increase in current flow between the source and drain when a sufficient voltage is applied to the gate of the transistor.

To further enhance the performance of metal-oxide-semiconductor (MOS) devices, stress may be introduced in the channel region of a MOS transistor to improve carrier mobility. Generally, it is desirable to induce a tensile stress in the channel region of an n-type MOS (NMOS) device in a source-to-drain direction and to induce a compressive stress in the channel region of a p-type MOS (PMOS) device in a source-to-drain direction.

A commonly used method for applying compressive stress to the channel regions of PMOS devices is to grow silicon-germanium (SiGe) stressors in source and drain regions. Such a method typically includes the steps of forming a gate stack on a semiconductor substrate; forming spacers on sidewalls of the gate stack; forming recesses in the silicon substrate along the gate spacers; epitaxially growing SiGe stressors in the recesses, and then annealing. Since SiGe has a greater lattice constant than silicon has, it expands after annealing and applies a compressive stress to the channel region, which is located between a source SiGe stressor and a drain SiGe stressor.

The conventional stressor formation processes suffer drawbacks, however. Boron is a commonly used p-type impurity for source/drain regions and lightly doped source/drain regions. To reduce sheet resistance, it is preferred that the boron concentration is high. However, the addition of boron has the effect of reducing lattice constant, and thus with a higher boron concentration, the strain introduced by SiGe stressors becomes more relaxed. In addition, a high boron concentration results in more boron to be diffused into channel regions, and the short channel characteristics are adversely affected.

Therefore, new methods for preserving a high boron concentration in MOS devices without incurring the drawbacks are needed.

SUMMARY OF THE INVENTION

In accordance with one aspect of the present invention, a semiconductor includes a semiconductor substrate, a gate stack on the semiconductor substrate, and a stressor having at least a portion in the semiconductor substrate and adjacent to the gate stack. The stressor includes a first stressor region and a second stressor region on the first stressor region, wherein the second stressor region extends laterally closer to a channel region underlying the gate stack than the first stressor region.

In accordance with another aspect of the present invention, a semiconductor structure includes a semiconductor substrate, a gate stack on the semiconductor substrate, a gate spacer on a sidewall of the gate stack, a shallow stressor having at least a portion in the semiconductor substrate and adjacent to the gate stack wherein the shallow stressor extends under the gate spacer, and a deep stressor underlying and adjoining the shallow stressor, wherein the deep stressor is substantially free from under the gate spacer.

In accordance with yet another aspect of the present invention, a semiconductor structure includes a semiconductor substrate, a gate stack on the semiconductor substrate, and a SiGe stressor having at least a portion in the semiconductor substrate and adjacent to the gate stack. The SiGe stressor includes a first SiGe region having a first atomic percentage of germanium to germanium and silicon, and a second SiGe region on the first SiGe region and having a second atomic percentage of germanium to germanium and silicon, wherein the second atomic percentage is greater than the first atomic percentage, and wherein the second SiGe region is laterally closer to a channel region than the first SiGe region.

In accordance with yet another aspect of the present invention, a method for forming a semiconductor structure includes providing a semiconductor substrate, forming a gate stack on the semiconductor substrate, and forming a stressor having at least a portion in the semiconductor substrate and adjacent to the gate stack. The step of forming the stressor includes forming a first stressor region, and forming a second stressor region on the first stressor region, wherein the second stressor region extends laterally closer to a channel region underlying the gate stack than the first stressor region.

In accordance with yet another aspect of the present invention, a method of forming a semiconductor structure includes providing a semiconductor substrate, forming a gate stack on the semiconductor substrate, forming a gate spacer on a sidewall of the gate stack, forming a disposable spacer on a sidewall of the gate spacer, forming a first recess along a sidewall of the disposable spacer, removing the disposable spacer, forming a second recess along the sidewall of the gate spacer wherein the second recess is substantially shallower than the first recess, forming a first SiGe region in the first recess, and forming a second SiGe region in the second recess.

The advantageous features of the present invention includes increased stress applied to channel regions of MOS devices due to shorter distances between stressors and the channel regions, and reduced impurity diffusion into the channel regions due to low impurity concentrations in regions close to the channel regions.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for improving the formation of stressors is illustrated in FIGS. 1 through 10. Throughout the various views and illustrative embodiments of the present invention, like reference numbers are used to designate like elements.

Figure 1:
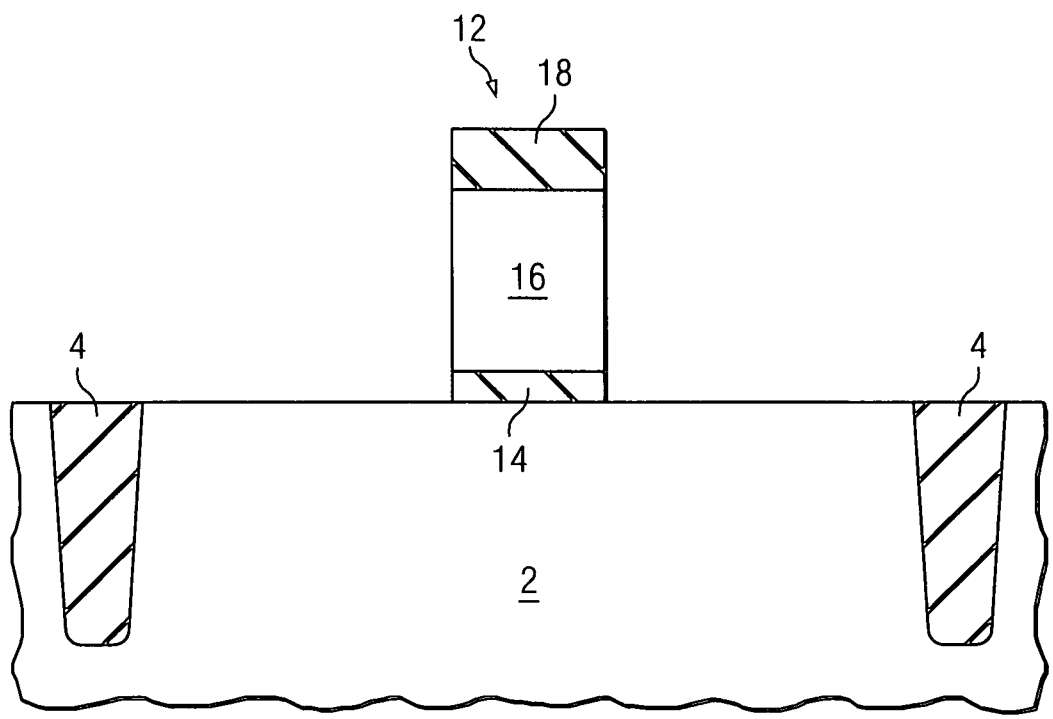
FIGS. 1 through 10 are cross-sectional views of intermediate stages in the manufacturing of a preferred embodiment, wherein SiGe stressors comprise two regions having different compositions.

Referring to FIG. 1, a substrate 2 is provided. Substrate 2 is preferably a bulk silicon substrate. Alternatively, substrate 2 comprises bulk silicon-germanium (SiGe) (with a low germanium concentration) or other semiconductor materials. Substrate 2 may also have a composite structure such as silicon-on-insulator (SOI). Shallow trench isolation (STI) regions 4 are formed in substrate 2 to isolate device regions. As is known in the art, STI regions 4 may be formed by etching recesses in substrate 2, and then filling the recesses with dielectric materials.

Figure 2:
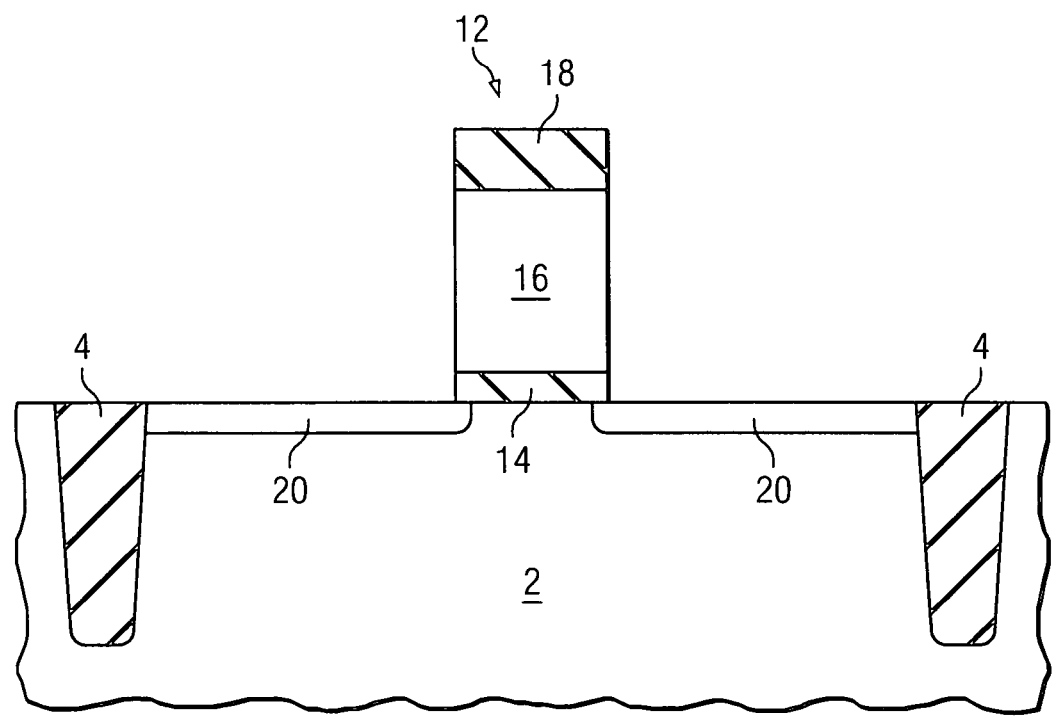

Referring to FIG. 2, a gate stack 12, which comprises a gate dielectric 14, a gate electrode 16 and a hard mask 18, is formed on substrate 2. Gate dielectric 14 includes commonly used dielectric materials such as oxides, nitrides, oxynitrides, oxycarbide, and combinations thereof. Gate electrode 16 may include doped polysilicon, metals, metal silicides, metal nitrides, and combinations thereof. Hard mask 18 may comprise silicon nitride or other materials such as oxides, oxynitrides, and silicon carbide. As is known in the art, gate dielectric 14, gate electrode 16 and hard mask 18 may be formed by depositing stacked layers including a gate electrode layer on a gate dielectric layer, and a mask layer on the gate electrode layer, and then patterning the stacked layers.

An optional pre-amorphized implantation (PAI) may be performed to reduce the dopant channeling effect and enhance dopant activation. In the preferred embodiment, silicon, germanium and/or carbon are implanted. In other embodiments, inert gases, such as neon, argon, krypton, xenon, and radon, are used. The pre-amorphized implantation prevents subsequently doped impurities from channeling through spaces between the crystal lattice structure and reaching depths greater than desired.

Lightly doped source/drain (LDD) regions 20 are then formed, preferably by implanting a p-type impurity, as is shown in FIG. 2. Gate stack 12 acts as a mask so that LDD regions 20 are substantially aligned with the edges of the respective gate stack 12. Halo/pocket regions (not shown) are also formed, preferably by implanting n-type impurities.

Figure 3:
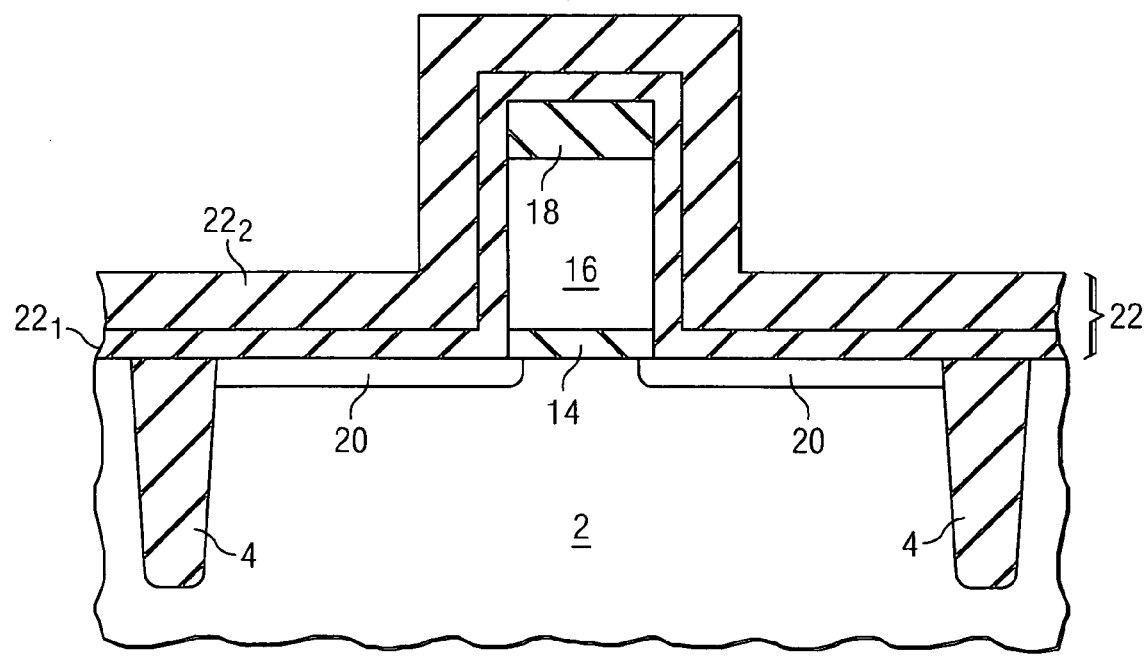

Referring to FIG. 3, a gate spacer layer 22 is formed. In the preferred embodiment, gate spacer layer 22 includes a liner oxide layer $22_1$ and an overlying silicon nitride layer $22_2$. In alternative embodiments, gate spacer layer 22 includes one or more layers, each comprising oxide, silicon nitride, silicon oxynitride (SiON) and/or other dielectric materials, and may be formed using commonly used techniques, such as plasma enhanced chemical vapor deposition (PECVD), low-pressure chemical vapor deposition (LPCVD), sub-atmospheric chemical vapor deposition (SACVD), and the like.

Figure 4:
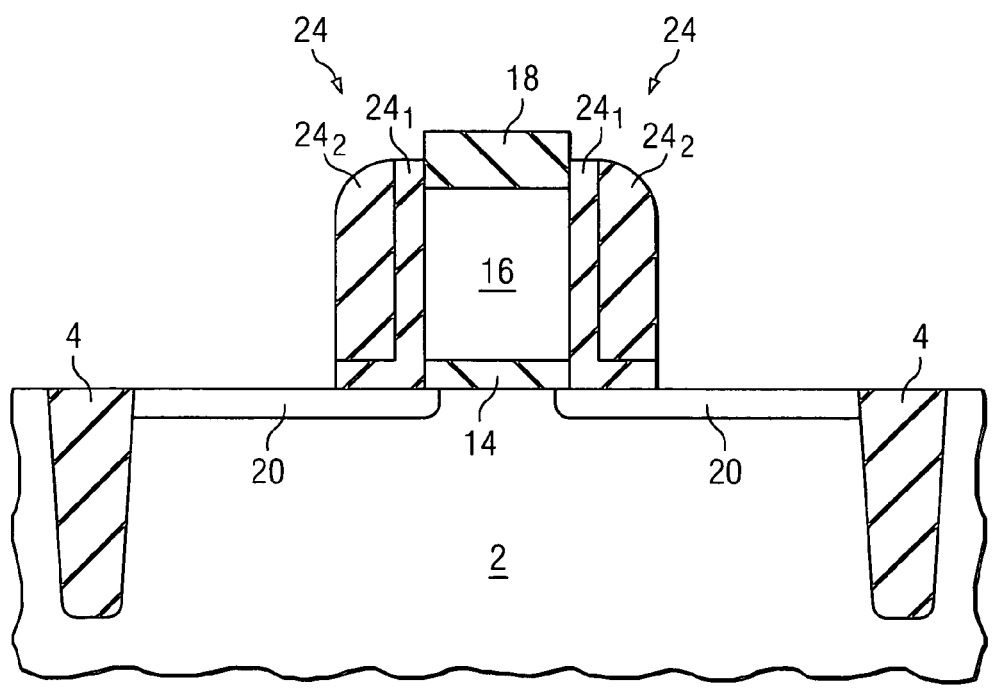
Figure 5:
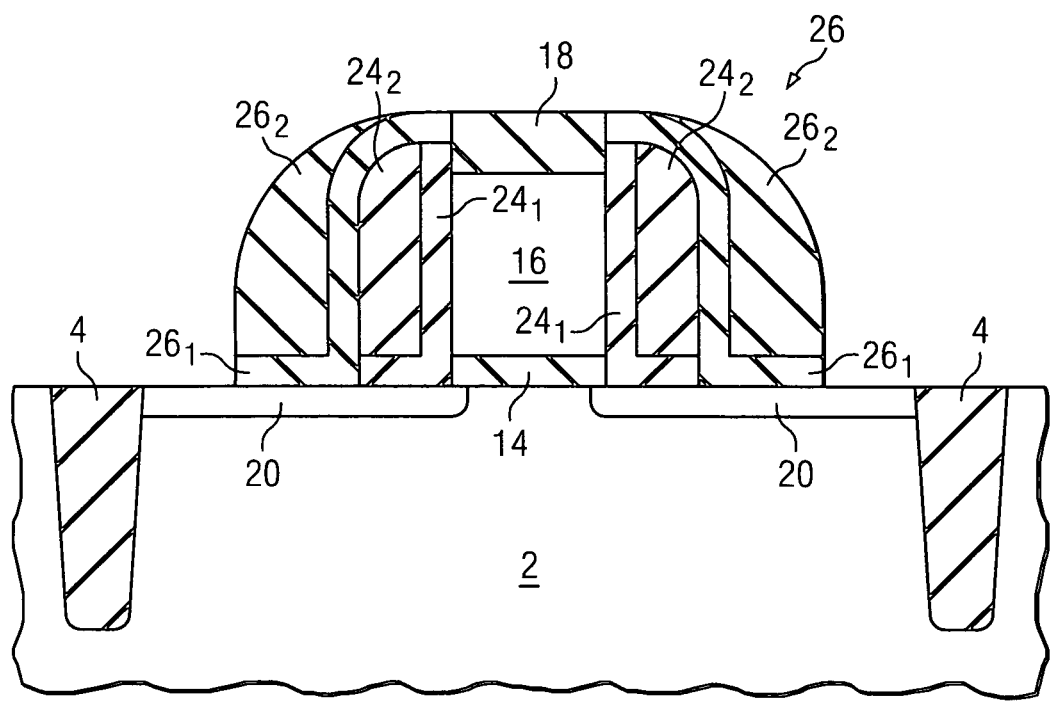

FIG. 4 illustrates the patterning of gate spacer layer 22 to form gate spacers 24, wherein the patterning may be performed by either wet etching or dry etching. Horizontal portions of gate spacer layer 22 are removed, and the remaining portions of liner oxide layer $22_1$ and silicon nitride layer $22_2$ form liner oxide portions $24_1$ and silicon nitride portions $24_2$, respectively.

FIG. 4 illustrates the formation of disposable spacers 26. Similar to spacers 24, disposable spacers 26 may be formed by blanket depositing a liner oxide layer, forming a silicon nitride layer on the liner oxide layer, and removing horizontal portions of the liner oxide layer and the silicon nitride layer. Accordingly, the preferred disposable spacers 26 include silicon nitride portions $26_2$ on liner oxide portions $26_1$. Alternatively, disposable spacers 26 may include other materials having different etching characteristics from the underlying spacers 24.

Figure 6:
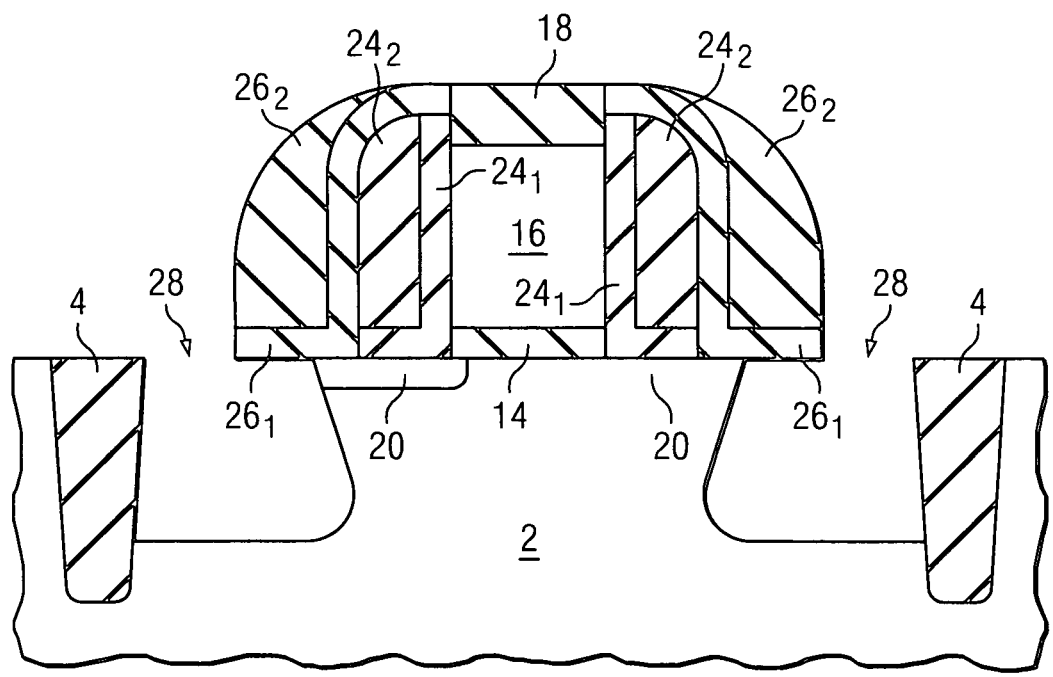

Referring to FIG. 6, recesses 28 are formed along the edges of disposable spacers 26, preferably by etching isotropically or anisotropically. The depth of recesses 28 is preferably greater than the depth of the channel region of the resulting metal-oxide-semiconductor (MOS) device.

Figure 7:
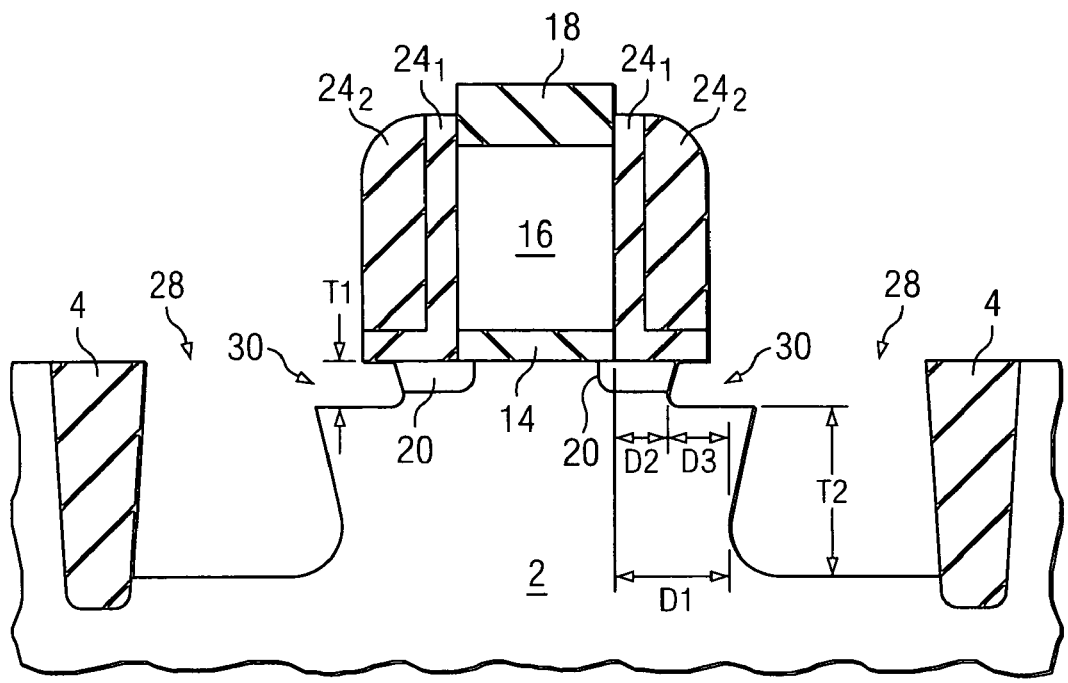

In FIG. 7, disposable spacers 26 are removed. In an exemplary embodiment, the silicon nitride portions of disposable spacers 26 are removed by etching in phosphoric acid, and the liner oxide portions of disposable spacers 26 are stripped using diluted hydrofluoric acid. A second recessing process is then performed to form recesses 30. During the second recessing process, recesses 28 are deepened, and are likely to expand toward a region underlying gate electrode 16. Due to the removal of disposable spacers 26, recesses 30, which are closer to the channel region of the resulting MOS device, are formed. Recesses 30 are preferably substantially shallower than recesses 28. Recesses 30 may extend under spacers 24, while recesses 28 may or may not extend under spacers 24, depending on the thickness of disposable spacers 26.

In an exemplary embodiment, depth T1 of recesses 30 is preferably between about 50 Å and about 200 Å. More preferably, depth T1 of recesses 30 is less than about 70 percent of depth T2 of recesses 28. More preferably, depth T1 is between about 20 percent and about 70 percent of depth T2. In 90 nm technology, the combined depth of recesses 28 and 30 is between about 500 Å and about 1000 Å, and more preferably between about 700 Å and 900 Å.

A lateral distance DI between the edges of recesses 28 to the respective edges of gate electrode 16 is preferably between about 10 nm and about 30 nm. A lateral distance D2 between edges of recesses 30 to the respective edges of gate electrode 16 is preferably between about 3 nm and about 15 nm. Recesses 30 extend more toward the channel region than recesses 28. In an exemplary embodiment, the inner edges of recesses 28 and 30 preferably have a lateral difference D3 of about 5 nm and about 15 nm. It should be appreciated, however, that the dimensions recited throughout the description are merely examples, and the dimensions may scale accordingly with the scaling of technologies used for the formation of integrated circuits.

Figure 8:
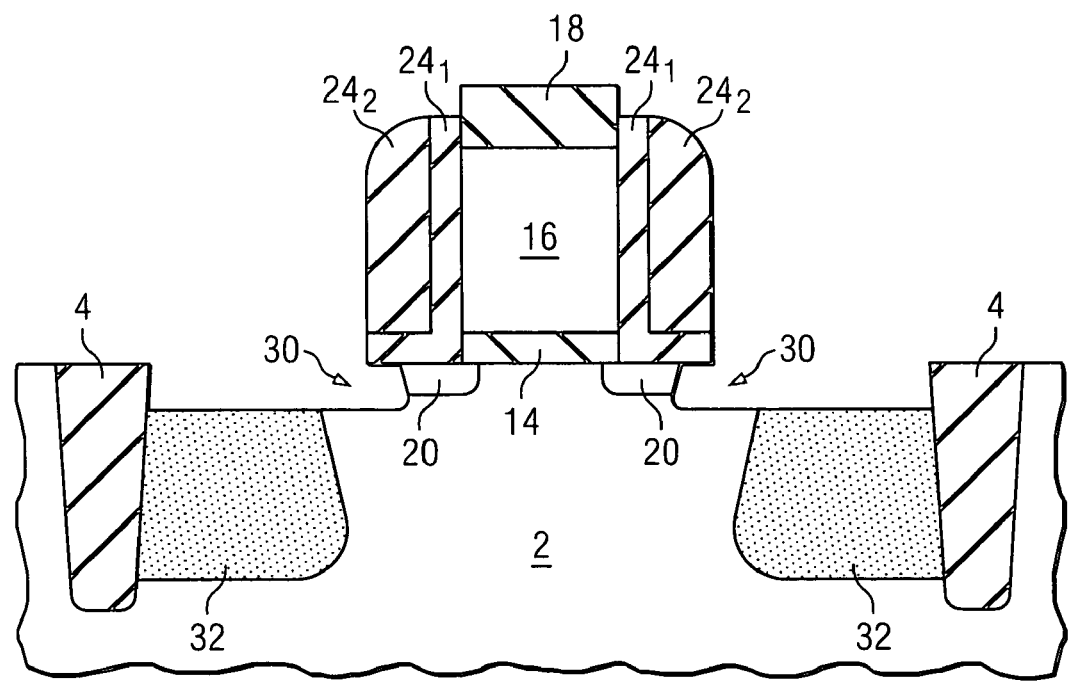

FIG. 8 illustrates the formation of epitaxy regions, often referred to as SiGe stressors or SiGe regions. SiGe regions 32 are first epitaxially grown in recesses 28 by selective epitaxial growth (SEG). SiGe regions 32 preferably have a lattice spacing greater than the lattice spacing of substrate 2. In an exemplary embodiment, SiGe regions 32 are formed using PECVD in a chamber, in which the pressure is preferably between about 10 torr and about 200 torr. The preferred temperature is between about 400° C. and about 1000° C. The precursors include Si-containing gases and Ge-containing gases, such as $SiH_4$ and $GeH_4$, respectively, and the partial pressures of the Si-containing gases and Ge-containing gases are adjusted to modify the atomic ratio of germanium to silicon. In the preferred embodiment, the resulting SiGe regions 32 include between about 15 atomic percent and about 25 atomic percent germanium. It has been found that in such a structure, SiGe is typically epitaxially grown in recesses 28 first, while very little SiGe is formed in recesses 30 (particularly sidewalls of recesses 30) before recesses 28 are filled. In the preferred embodiment, the formation of SiGe regions 32 is stopped when their top surfaces are substantially level with bottom surfaces of recesses 30.

During the epitaxial process for forming SiGe regions 32, p-type impurities, such as boron, are doped. Preferably, the p-type impurity concentration is between about $5 \times 10^{20}/cm^3$ and about $1 \times 10^{21}/cm^3$, or between about one atomic percent to about two atomic percent, wherein the recited atomic percentage is the atomic percentage of p-type impurity atoms to atoms of silicon, germanium and the p-type impurity atoms.

Figure 9:
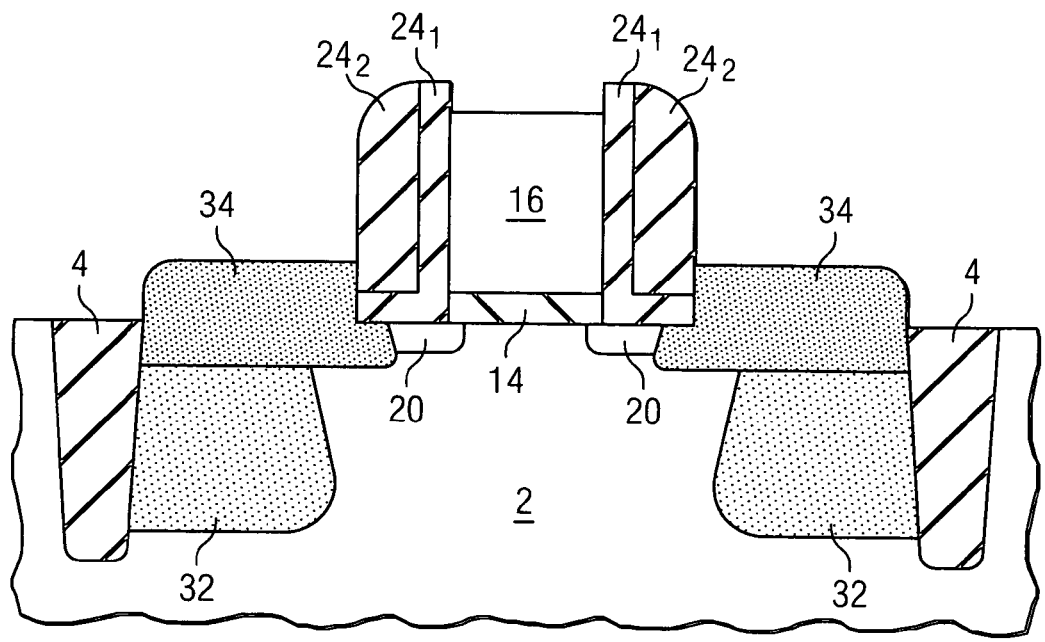

Referring to FIG. 9, process conditions for the epitaxial process are changed to form SiGe regions 34 on SiGe regions 32, wherein more germanium is introduced than in the formation of SiGe regions 32. Preferably, the formation of SiGe regions 34 is performed in-situ with the formation of SiGe regions 32. In an exemplary embodiment, the partial pressures, hence flow rates, of the Ge-containing gases such as $GeH_4$ is increased to increase the germanium concentration in SiGe regions 34. The resulting SiGe regions 34 have a higher germanium concentration, which is preferably between about 25 atomic percent and about 40 atomic percent, than SiGe regions 32. More preferably, the atomic percentage of germanium in SiGe regions 34 and the atomic percentages of germanium in SiGe regions 32 have a difference of greater than about 5 atomic percent.

The epitaxial process for forming SiGe regions 34 is also preferably accompanied by the doping of p-type impurities, such as boron, wherein the p-type impurity concentration in SiGe regions 34 is preferably less than the p-type impurity concentration in SiGe regions 32. In an exemplary embodiment, the p-type impurity concentration in SiGe regions 34 is between about $1 \times 10^{19}/cm^3$ and about $5 \times 10^{20}/cm^3$, or between about 0.02 atomic percent to about one atomic percent. Preferably, the p-type impurity concentration in SiGe regions 32 is less than about 10 percent, or even about 1 percent, of the atomic percentage in SiGe regions 34. SiGe regions 32 and 34 may be doped with different p-type impurities. For example, SiGe regions 34 are doped with boron while SiGe regions 32 are doped with indium. The doped SiGe regions 32 and 34 form at least portions of the source/drain regions of the resulting p-type MOS (PMOS) device. After the formation of SiGe regions 34, an implantation of p-type impurities may further be performed for the formation of source/drain regions optionally.

Figure 10:
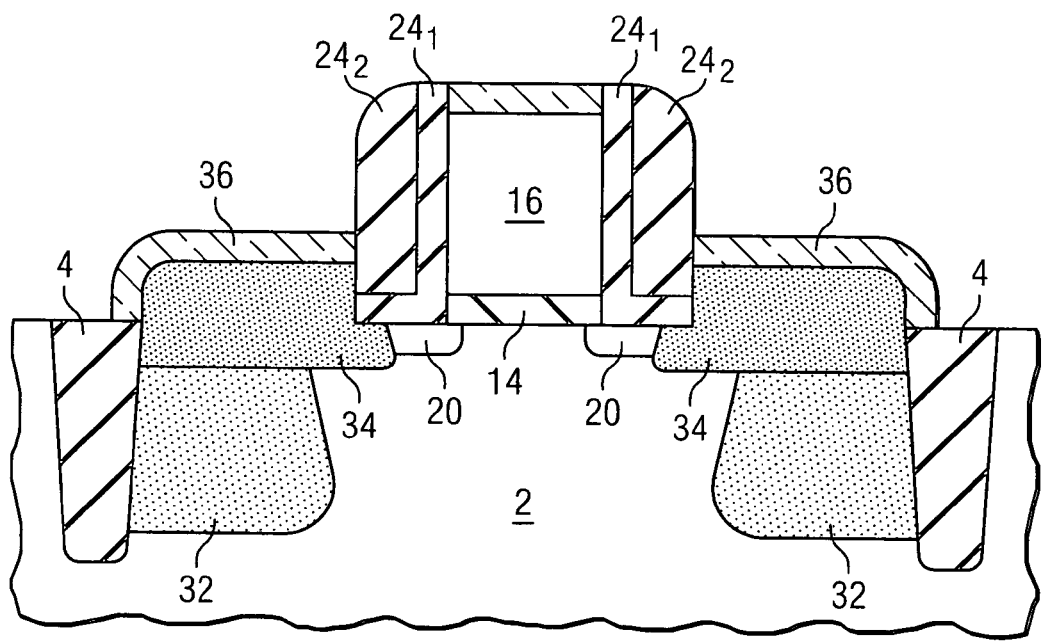

FIG. 10 illustrates the formation of germano-silicide regions 36. Throughout the description, germano-silicide regions 36 are also referred to as silicide regions 36. As is known in the art, germano-silicide regions 36 are preferably formed by blanket depositing a thin layer of metal (not shown), such as nickel, platinum, palladium, vanadium, titanium, cobalt, tantalum, ytterbium, zirconium, and combinations thereof. The substrate is then heated, which causes silicon and germanium to react with the metal where contacted. After the reaction, a layer of metal silicide and/or metal germano-silicide is formed between silicon/germanium and metal. The un-reacted metal is selectively removed through the use of an etchant that attacks metal but does not attack silicide and germano-silicide.

The concept of the present invention can also be applied to the formation of n-type MOS (NMOS) devices, which preferably have SiC stressors. Similar to the embodiment shown in FIG. 10, the NMOS embodiments preferably include a first SiC stressor on a second SiC stressor, and the first SiC stressor is closer to the channel region than the second SiC stressor. The first and the second SiC stressors are preferably doped with n-type impurities, such as phosphorus and arsenic, which also have the effect of relaxing the stress applied by the first and the second SiC stressors. In addition, The first SiC stressor preferably has a lower n-type impurity concentration than the second SiC stressor, and the respective impurity concentrations in the first and the second SiC stressors may have a similar ratio as a ratio of an impurity concentration in SiGe regions 34 to an impurity concentration in SiGe regions 32.

The preferred embodiments of the present invention have several advantageous features. SiGe regions 34, which are on opposite sides of the channel region of the MOS device, have a high germanium atomic percentage, and thus apply a high stress to the channel region of the respective MOS device. The extension of SiGe regions 34 closer to the channel region further increases the stress. On the other hand, impurity concentration in SiGe regions 34, which extends into LDD regions 20, is low. Therefore, less impurity is diffused into channel region, and the adverse effects to the short channel characteristics are reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a semiconductor substrate;
   a gate stack on the semiconductor substrate; and
   an epitaxial stressor having at least a portion in the semiconductor substrate and adjacent to the gate stack, wherein the epitaxial stressor comprises:
      a first stressor region formed in a deep recess spaced apart from the gate stack; and
      a second stressor region on the first stressor region formed in a shallow recess that extends under a gate spacer, wherein the second stressor region extends laterally closer to a channel region underlying the gate stack than the first stressor region, the first stressor region having different stress characteristics than the second stressor region.

2. The semiconductor structure of claim 1, wherein the epitaxial stressor comprises SiGe.

3. The semiconductor structure of claim 2, wherein the first stressor region has a first atomic percentage of germanium to germanium and silicon, the second stressor region has a second atomic percentage of germanium to germanium and silicon, and the second atomic percentage is higher than the first atomic percentage.

4. The semiconductor structure of claim 1, wherein the first stressor region has a first impurity concentration and the second stressor region has a second impurity concentration, and wherein the first impurity concentration is greater than the second impurity concentration.

5. The semiconductor structure of claim 1, wherein the epitaxial stressor comprises SiC.

6. The semiconductor structure of claim 1, wherein the second stressor region is closer to the channel region than the first stressor region by greater than about 5 nm.

7. The semiconductor structure of claim 1, wherein the first stressor region has a first thickness and the second stressor region has a second thickness, and wherein the second thickness is between about 20 and about 70 percent of the first thickness.

8. A semiconductor structure comprising:
   a semiconductor substrate;
   a gate stack on the semiconductor substrate;
   a gate spacer on a sidewall of the gate stack;
   a shallow epitaxial stressor disposed in a shallow recess having at least a portion in the semiconductor substrate and adjacent to the gate stack, wherein the containing the shallow epitaxial stressor extends under the gate spacer; and
   a deep epitaxial stressor underlying and adjoining the shallow epitaxial stressor and disposed in a deep recess in the semiconductor substrate and spaced apart from the gate stack, wherein the region of the semiconductor substrate directly underlying the gate spacer is free from the deep epitaxial stressor, the shallow epitaxial stressor being a different material than the deep epitaxial stressor.

9. The semiconductor structure of claim 8, wherein the shallow epitaxial stressor comprises SiGe, and wherein the deep epitaxial stressor comprises SiGe.

10. The semiconductor structure of claim 8, wherein the deep epitaxial stressor has a first impurity concentration, and the shallow epitaxial stressor has a second impurity concentration, and wherein the first impurity concentration is greater than the second impurity concentration.

11. The semiconductor structure of claim 8, wherein the shallow epitaxial stressor extends toward a channel region underlying the gate stack further than the deep epitaxial stressor by a distance of greater than about 5 nm.

12. A semiconductor structure comprising:
    a semiconductor substrate;
    a gate stack on the semiconductor substrate; and
    a SiGe stressor having at least a portion in the semiconductor substrate and adjacent to the gate stack, wherein the SiGe stressor comprises:
    a first SiGe region formed as a first epitaxial layer in a deep recess spaced apart from the gate stack and having a first atomic percentage of germanium to germanium and silicon; and
    a second SiGe region formed as a second epitaxial layer in a shallow recess that extends under the gate stack and formed on the first SiGe region and having a second atomic percentage of germanium to germanium and silicon, wherein the second atomic percentage is greater than the first atomic percentage, and wherein the second SiGe region is laterally closer to a channel region than the first SiGe region.

13. The semiconductor structure of claim 12, wherein the second atomic percentage is between about 25 percent and about 40 percent, and wherein the first atomic percentage is between about 15 percent and about 25 percent.

14. The semiconductor structure of claim 12, wherein the first atomic percentage is less than about the second atomic percentage by greater than about 5 atomic percent.

15. The semiconductor structure of claim 12, wherein the first SiGe region has a first p-type impurity concentration and the second SiGe stressor has a second p-type impurity concentration less than the first p-type impurity concentration.

16. The semiconductor structure of claim 15, wherein the first p-type impurity concentration is between about $5 \times 10^{20}/cm^3$ and about $1 \times 10^{21}/cm^3$, and the second p-type impurity concentration is between about $1 \times 10^{19}/cm^3$ and about $5 \times 10^{20}/cm^3$.

17. The semiconductor structure of claim 15, wherein second p-type impurity concentration is less than about 10 percent of the first p-type impurity concentration.

18. The semiconductor structure of claim 9, wherein the deep epitaxial stressor has a first atomic percentage of germanium to germanium and silicon, and the shallow epitaxial stressor has a second atomic percentage of germanium to germanium and silicon, and wherein the first atomic percentage is less than the second atomic percentage.

19. The semiconductor structure of claim 8, wherein the shallow epitaxial stressor comprises SiC, and wherein the deep epitaxial stressor comprises SiC.

20. The semiconductor structure of claim 8, wherein the deep epitaxial stressor has a first thickness and the shallow epitaxial stressor has a second thickness, and wherein the second thickness is between about 20 and about 70 percent of the first thickness.

* * * * *

UNITED STATES PATENT AND TRADEMARK OFFICE
CERTIFICATE OF CORRECTION

PATENT NO. : 7,750,338 B2 Page 1 of 1
APPLICATION NO. : 11/633855
DATED : July 6, 2010
INVENTOR(S) : Wang It is certified that error appears in the above-identified patent and that said Letters Patent is hereby corrected as shown below:

In Col. 7, between lines 19 and 20, claim 8, insert --a region of the semiconductor substrate directly underlying the gate spacer;--.
In Col. 7, line 22, claim 8, before containing insert --recess--.

Signed and Sealed this

Twenty-fourth Day of August, 2010

David J. Kappos
*Director of the United States Patent and Trademark Office*